United States Patent
Doyle

(10) Patent No.: US 7,541,808 B2
(45) Date of Patent: Jun. 2, 2009

(54) RAPID MRI DYNAMIC IMAGING USING MACH

(75) Inventor: Mark Doyle, Wexford, PA (US)

(73) Assignee: Allegheny-Singer Research Institute, Pittsburgh, PA (US)

( * ) Notice: Subject to any disclaimer, the term of this patent is extended or adjusted under 35 U.S.C. 154(b) by 0 days.

(21) Appl. No.: 11/786,685

(22) Filed: Apr. 11, 2007

(65) Prior Publication Data

US 2008/0252290 A1    Oct. 16, 2008

(51) Int. Cl.
*G01V 3/00* (2006.01)
(52) U.S. Cl. ............................. 324/309; 324/307
(58) Field of Classification Search ................ 324/309, 324/307, 318–322, 300; 600/407, 410; 128/653
See application file for complete search history.

(56) References Cited

U.S. PATENT DOCUMENTS

| | | | | |
|---|---|---|---|---|
| 5,713,358 | A * | 2/1998 | Mistretta et al. | 600/420 |
| 6,630,828 | B1 * | 10/2003 | Mistretta et al. | 324/309 |
| 7,005,853 | B2 * | 2/2006 | Tsao et al. | 324/309 |
| 7,023,207 | B1 * | 4/2006 | Gaddipati et al. | 324/309 |
| 7,245,125 | B2 * | 7/2007 | Harer et al. | 324/310 |
| 2007/0110290 | A1 * | 5/2007 | Chang et al. | 382/128 |
| 2007/0252597 | A1 * | 11/2007 | Posse | 324/312 |

OTHER PUBLICATIONS

Pipe, J. G., "Reconstructing MR Images From Undersampled Data: Data-Weighting Considerations," Magnetic Resonance in Medicine, Adademic Press (Duluth, MN, US), (vol. 43), (Issue. 6), (p. 867-875), (Jun. 1, 2000).

Tsai, C-M et al., "Reduced Aliasing Aritfacts Using Variable-Density k-Space Sampling Trajectories," Magnetic Resonance in Medicine, Academic Press (Duluth, MN, US), (vol. 43), (Issue. 3), (p. 452-458), (Mar. 1, 2000).

Oliver M. Geier et al., "Parallel Acquistion for Effective Density Weighted Imaging: PLANED Imaging," Magnetic Resonance Materials in Physics, Biology and Medicine, Chapman and Hall (London, GB), (vol. 20), (Issue. 1), (p. 19-25), (Jan. 20, 2007).

(Continued)

*Primary Examiner*—Brij B. Shrivastav
(74) *Attorney, Agent, or Firm*—Ansel M. Schwartz

(57) ABSTRACT

An MRI includes at least a singular imaging channel which uses a smoothly varying sampling pattern to sparsely sample k-space as a series of parallel lines over time to acquire data of an object. The MRI includes a computer in communication with the imaging channel that performs a signal processing routine to interpolate the data and fill in points of k-space which were not sampled by the imaging channels and produce an image of the object. A method for using an MRI includes the steps of acquiring data of an object with at least a singular imaging channel of the MRI which uses a smoothly varying sampling pattern to sparsely sample k-space as a series of parallel lines over time. There is the step of performing a signal processing routine with a computer in communication with the imaging channel to interpolate the data and fill in points of k-space which were not sampled by the imaging channels. There is the step of producing an image of the object.

11 Claims, 5 Drawing Sheets

OTHER PUBLICATIONS

Doyle, M. et al., "Block Regional Interpolation Scheme for K-Space (BRISK): A Rapid Cardiac Imaging Technique," Magnetic Resonance in Medicine, Academic Press (Duluth, MN, US), (vol. 33), (p. 163-170), (Jan. 1, 1995).

Tsao, J. et al., "k-t BLAST and k-t SENSE: Dynamic MRI With High Frame Rate Exploiting Spatiotemporal Correlations," Magnetic Resonance in Medicine, Academic Press (Duluth, MN, US), (vol. 50), (Issue. 5), (p. 1031-1042), (Nov. 1, 2003).

Sabastian Kozerke, et al., "Accelerating Cardiac Cine 3D Imaging Using k-t BLAST," Magnetic Resonance in Medicine, Wiley-Liss, Inc., (vol. 52), (p. 19-26), (2004).

Jeffrey Tsao, et al., "k-t BLAST and k-t SENSE: Dynamic MRI With High Frame Rate Exploiting Spatiotemporal Correlations," Magnetic Resonance in Medicine, Wiley-Liss, Inc., (vol. 50), (p. 1031-1042), (2003).

J. Tsao, et al., "Eight-fold acceleration in real-time cardiac imaging using k-t BLAST and k-t SENSE with SSFP and segmented EPI," Proc. Intl. Soc. Mag. Reson. Med., (vol. 11), (p. 209), (2003).

Wolfgang G. Rehwald, PHD, et al., "Theory of High-Speed MR Imaging of the Human Heart with the Selective Line Acquisition Mode," Radiology, (vol. 220, No. 2), (p. 540-547), (Aug. 2001).

* cited by examiner

RAPID MRI DYNAMIC IMAGING USING MACH

FIELD OF THE INVENTION

The present invention is related to producing an image of an object by using a smoothly varying sampling pattern to sparsely sample k-space as a series of parallel lines over time to acquire data of the object. More specifically, the present invention is related to producing an image of an object by using a smoothly varying sampling pattern to sparsely sample k-space as a series of parallel lines over time to acquire data of the object where the sparse sampling factor of the sampling pattern varies in a progressively increasing manner from the center of k-space to the periphery.

BACKGROUND OF THE INVENTION

There is a rapid imaging approach termed BRISK, see FIG. 7. FIG. 7 is a schematic of the BRISK sampling scheme. The top row represents the series of k-space data sets, each data set representing the data form one image frame of a time series. The blue pattern represents the sparse sampling scheme of BRISK (in this case resolved over the cardiac cycle). At each cardiac time point, only a fraction of k-space is sampled. Following the acquisition, the sparsely sampled k-space data are temporally interpolated to make a complete k-space matrix for each time frame. In the BRISK approach, the sampling of k-space data over the time is performed in a sparse manner (i.e. the sampling is distributed over the so called k-t domain). Since BRISK was introduced, others have applied k-t sampling approaches, such as KT-BLAST, which employ uniform levels of sparse sampling. A unique feature of BRISK is that several sparse sampling factors are employed, with the lowest factor applied towards the center of k-space and higher factors applied towards the periphery of k-space, FIG. 5. However, simulations were performed to identify that the sudden transitions of sampling rate that occur between k-space regions were, in part, responsible for generation of Gibbs ringing artifacts in the final BRISK image. Gibbs artifacts manifest as repeating edges in images and are related to sudden transitions that occur in the k-space domain, with the most abrupt transition occurring when k-space sampling is terminated. These artifacts are only apparent when very high sparse sampling factors are employed, limiting the effective acceleration of BRISK to a factor of 8. Experimentation showed that when a uniform sparse sampling factor was applied, the images did not suffer from Gibbs ringing but instead suffered from temporal blurring, i.e. dynamic features tended to gradually morph from one form to another. From this analysis, it was determined that the ideal sparse sampling pattern would only produce gradual change in the k-t domain, and from this, the present invention was developed.

In terms of the sampling pattern, KT-BLAST employs a uniform sampling pattern, and employs a different reconstruction technique, which involves the use of "training data", i.e. data in which the central region of k-space is sampled for 10-20 seconds, either separately from the KT-BLAST acquisition, or interleaved with the KT-BLAST acquisition. BRISK is characterized by a variable sampling scheme, but this sampling scheme has distinct sample rates applied to regions of k-space. In MACH, the variable sampling pattern is applied in a smoothly varying manner.

BRIEF SUMMARY OF THE INVENTION

The present invention pertains to an MRI. The MRI comprises at least a singular imaging channel which uses a smoothly varying sampling pattern to sparsely sample k-space as a series of parallel lines over time to acquire data of an object. The MRI comprises a computer in communication with the imaging channel that performs a signal processing routine to interpolate the data and fill in points of k-space which were not sampled by the imaging channels and produce an image of the object.

The present invention pertains to a method for using an MRI. The method comprises the steps of acquiring data of an object with at least a singular imaging channel of the MRI which uses a smoothly varying sampling pattern to sparsely sample k-space as a series of parallel lines over time. There is the step of performing a signal processing routine with a computer in communication with the imaging channel to interpolate the data and fill in points of k-space which were not sampled by the imaging channels. There is the step of producing an image of the object.

BRIEF DESCRIPTION OF THE SEVERAL VIEWS OF THE DRAWING

In the accompanying drawings, the preferred embodiment of the invention and preferred methods of practicing the invention are illustrated in which.

DETAILED DESCRIPTION OF THE INVENTION

Figure 10:
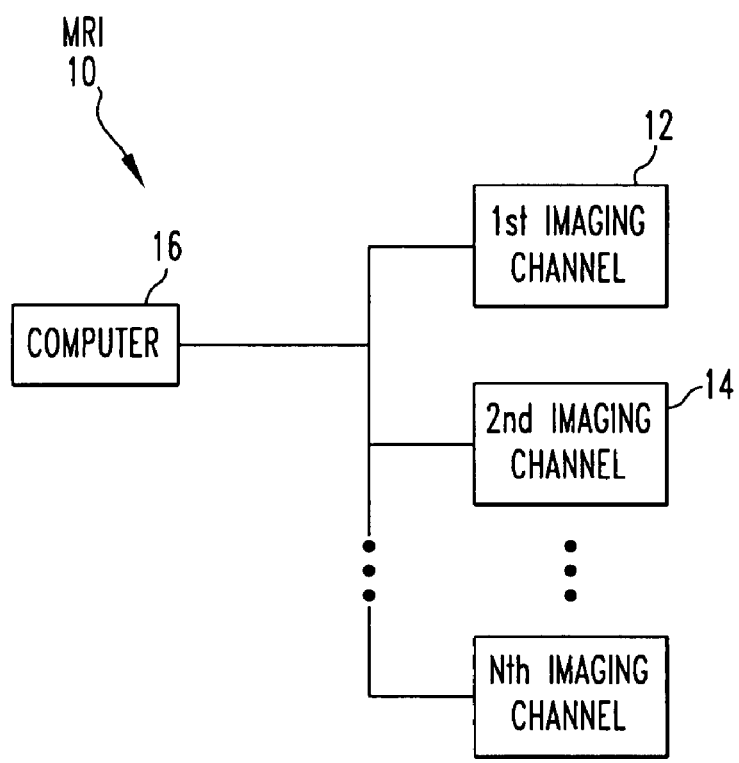
FIG. 10 is a block diagram of the present invention.

Referring now to the drawings wherein like reference numerals refer to similar or identical parts throughout the several views, and more specifically to FIG. 10 thereof, there is shown an MRI 10. The MRI 10 comprises at least a singular imaging channel 12 which uses a smoothly varying sampling pattern to sparsely sample k-space as a series of parallel lines over time to acquire data of an object. The MRI 10 comprises a computer 16 in communication with the imaging channel that performs a signal processing routine to interpolate the data and fill in points of k-space which were not sampled by the imaging channels and produce an image of the object.

Preferably, the MRI 10 includes at least a second imaging channel 14 which uses a smoothly varying sampling pattern to sparsely sample k-space as a series of parallel lines over time to acquire data of an object. The computer 16 is in communication with the imaging channels and performs a signal processing routine to interpolate the data and fill in points of k-space which were not sampled by the imaging channels and produce an image of the object. The sparse sampling pattern preferably varies from the center of k-space to the periphery.

Preferably, the sparse sampling factor of the sampling pattern varies in a progressively increasing manner from the center of k-space to the periphery. The progressively increasing sparse sampling pattern preferably smoothly varies such that the first-order derivative of the sparse sampling factor plotted from the center of k-space to the periphery does not have any discontinuities.

Preferably, the computer 16 redistributes sample points from time positions that have more than the average number of points to the same k-space position at a nearest time point that has fewer than the average number of sample points. The signal processing routine performed by the computer 16 preferably does not use training data. Preferably, the sparsely sampled data are interpolated along a temporal dimension to populate data points that were not directly acquired by the imaging channels.

The present invention pertains to a method for using an MRI 10. The method comprises the steps of acquiring data of an object with at least a singular imaging channel 12 of the MRI 10 which uses a smoothly varying sampling pattern to sparsely sample k-space as a series of parallel lines over time. There is the step of performing a signal processing routine with a computer 16 in communication with the imaging channel to interpolate the data and fill in points of k-space which were not sampled by the imaging channels. There is the step of producing an image of the object.

Preferably, the acquiring step includes the step of acquiring data of the object with at least a second imaging channel 14 of the MRI 10 which uses a smoothly varying sampling pattern to sparsely sample k-space as a series of parallel lines over time. The performing step preferably includes the step of performing the signal processing routine with the computer 16 in communication with the imaging channels to interpolate the data and fill in points of k-space which were not sampled by the imaging channels. Preferably, the acquiring step includes the step of acquiring data of the object with the imaging channels which uses the sparse sampling pattern that varies from the center of k-space to the periphery.

The acquiring step preferably includes the step of acquiring data of the object with the imaging channels where the sparse sampling factor of the sampling pattern varies in a progressively increasing manner from the center of k-space to the periphery. Preferably, the acquiring step includes the step of acquiring data of the object with the imaging channels where the progressively increasing sparse sampling pattern smoothly varies such that the first-order derivative of the sparse sampling factor plotted from the center of k-space to the periphery does not have any discontinuities.

The performing step preferably includes the step of redistributing with the computer 16 sample points from time positions that have more than the average number of points to the same k-space position at a nearest time point that has fewer than the average number of sample points. Preferably, the signal processing routine performed by the computer 16 does not use training data.

The performing step preferably includes the step of interpolating the sparsely sampled data along a temporal dimension to populate data points that were not directly acquired by the imaging channels.

In the operation of the invention, there is described an approach to acquire dynamic MRI 10 data rapidly. The invention involves utilizing a special sampling pattern to sparsely sample the MRI 10 signal space, termed k-space, over time. Associated with this specialized sampling pattern is a signal processing routing to interpolate the data and thereby fill in the unsampled points of k-space. The technique is capable of obtaining higher acceleration factors than comparable and competing approaches, attaining for any given acceleration factor improved fidelity of data and lower artifact levels. The invention is termed Multiple Acceleration Cycle Hierarchy, MACH.

Figure 8:
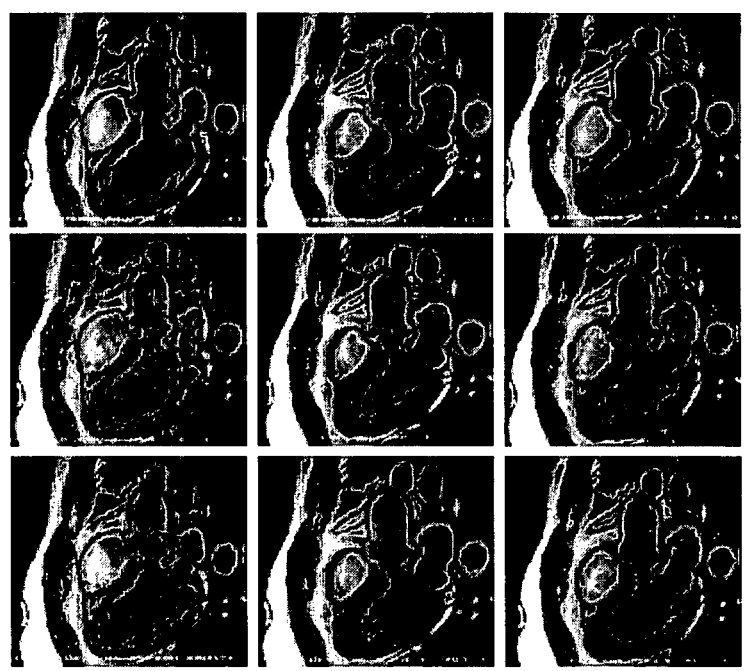
FIG. 8 shows corresponding frames from three series: original (top), simulated BRISK (middle), and simulated MACH (present invention) (lower) images.
Figure 9:
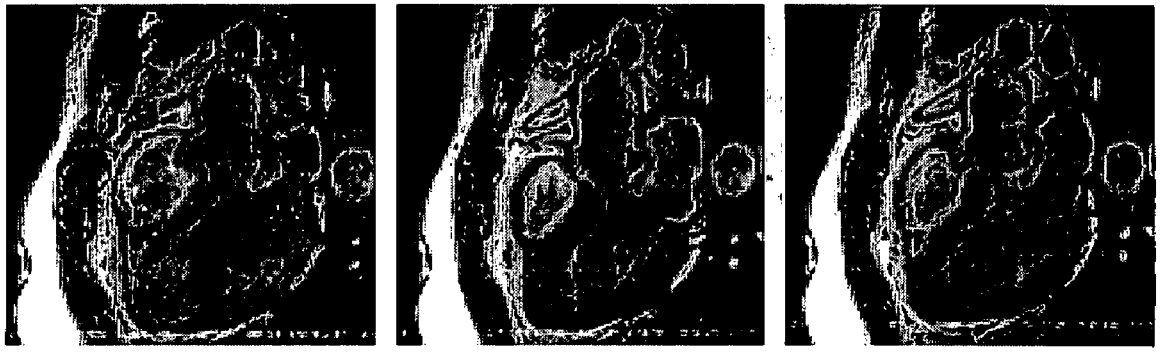
FIG. 9 shows simulated MACH images obtained with an acceleration factor of 12, corresponding to acquisition of 22 lines of k-space. Frames correspond to those of FIG. 8.

In MACH, the sparse sampling factor varies in small increments from the center of k-space to the periphery; e.g. at the center of k-space data are sampled at every time point, at the next line, data are sampled using a sparse factor of 1.1, the next line uses a sparse factor of 1.2, etc., until the outermost line of k-space employs a sparse factor of 3.2. Based on this simple premise, several refinements were developed to produce the MACH sampling pattern shown in FIG. 2. Simulations performed using conventional cine data to compare BRISK and MACH performance are shown in FIG. 8. FIG. 8 shows corresponding frames from three series: original (top), simulated BRISK (middle), and simulated MACH (lower) images. The original series utilized 256 lines of k-space while the BRISK and MACH series used 32 lines, corresponding to an acceleration factor of 8. Notice the clarity of myocardial walls and valve features in the MACH images seen against the blood pool signal, which has overall lower artifact content compared to the BRISK images. Note in particular the low degree of Gibbs ringing artifact in the first and last frames in the MACH series compared to the corresponding BRISK images. Also, note the fidelity with which cardiac features are followed compared to the original series. In this example, an acceleration factor of 8 was applied for BRISK and MACH. FIG. 9 shows MACH images simulated using an acceleration factor of 12, i.e. only 22 k-space lines out of a total of 256 were acquired at each cardiac phase. The MACH images follow the cardiac dynamics of the original series (FIG. 8) with remarkable fidelity. FIG. 9 shows simulated MACH images obtained with an acceleration factor of 12, corresponding to acquisition of 22 lines of k-space. Frames correspond to those of FIG. 8.

The MACH sampling and interpolation approach is suited for obtaining time resolved MRI 10 data in short scan times, such as imaging of the cardiovascular system are time resolved MR angiography, functional brain imaging, and real time MRI 10 applications, including interactive MRI 10, and MRI 10 guidance of surgical and interventional procedures.

The key features of the MACH scheme are:
1. Its use of variable sparse sampling strategy as opposed to a uniform sparse sampling strategy.
2. The sparse sampling factor increases in a smooth manner from the center of k-space to the periphery. This results in a highly irregular appearance to the sparse sampling pattern, whereas most approaches (including BRISK and KT-BLAST) use highly regular and structured sampling.
3. Approaches that use irregular sampling patterns have tended to use random or pseudo random approaches, whereas the MACH approach is based on a progression of rates.
4. MACH does not need any training data, and the technique is self-contained, with the reconstruction process being applied uniformly irrespective of the dynamic structure being observed.
5. Since MACH images are generated from a full set of k-space data, the signal to noise ratio is inherently high. This allows the MACH approach to be combined with other rapid imaging strategies to produce images in a faster mode. This is particularly important for real-time monitoring of interventions that can be applied in the MRI 10 scanner. Currently real-time imaging approaches in MRI 10 suffer from low temporal and spatial resolution. The MACH approach would allow higher resolution images to be acquired with a rapid update rate.

The present invention acquires time resolved magnetic resonance imaging data in a sparse manner such that the sparse-sampling factor varies in a progressively increasing manner from the center of k-space. The sparsely sampled data are interpolated along the temporal dimension to populate data points that were not directly acquired.

The key features are 1) that the sparse sampling factor increases with distance from the center of k-space, and 2) that the sparse sampling factor varies in a smoothly continuous manner.

The sparse sampling pattern can be achieved by a number of algorithms that achieve the two key features of 1) applying an increasing sparse factor from the center of k-space outwards and 2) increasing the sparse factor in a smoothly progressive manner. An illustrative example is provided here for k-space data comprised of a square matrix of size 256×256 to be acquired in a symmetric manner at regular time intervals. In this example the sparse sampling factor is set at 1 for the center of k-space and it is incremented in steps of 0.1 for successive line positions towards the upper and lower boundaries of k-space. In this concrete example, the sampling pattern is as follows:

The two central lines of k-space are sampled at each of the pre-determined time intervals, i.e. sparse sampling factor of 1

The two lines contiguous with the central lines are sampled at a sampling rate of 1:1.1 frames per time interval, i.e. sparse sampling factor 1.1.

The next two outermost lines of k-space are sampled at a rate of 1:1.2 frames per time interval, i.e. sparse sampling factor 1.2.

The pattern is continued until the outermost lines of k-space are sampled at rate of 1:13.7 frames per time interval, i.e. sparse sampling factor 13.7.

Figure 1:
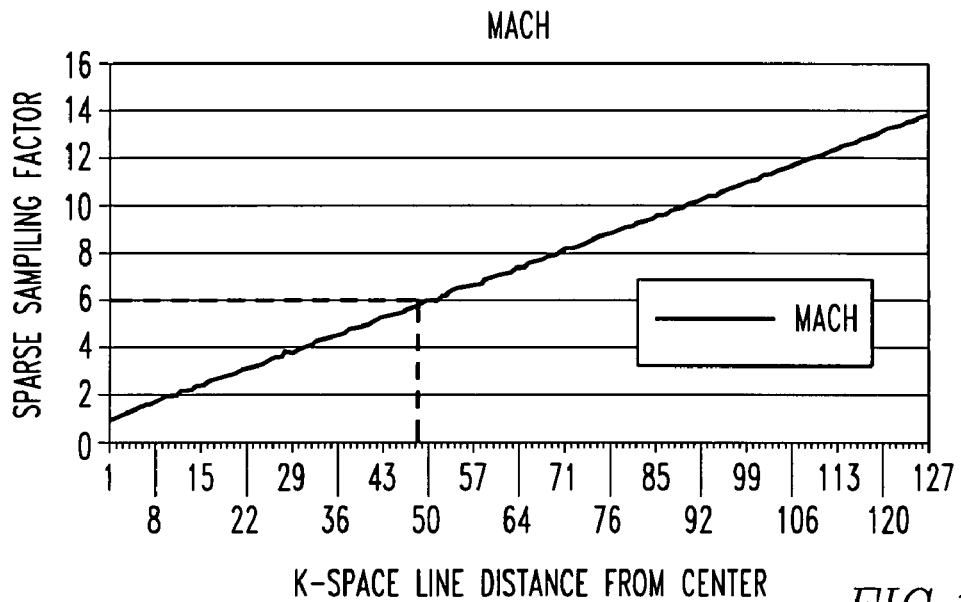
FIG. 1 is a graph of an example of a sparse sampling factor for the present invention.

For the above example, a graph showing the smoothly incrementing sparse sampling factor is illustrated in FIG. 1, which is a linearly increasing function. FIG. 1 is a graph of example sparse sample factor for MACH. The vertical axis shows the sparse sampling factor to be applied at each line position. The horizontal axis shows the distance of the k-space line from the center of k-space. The dashed lines show how to interpret the plot: for k-space lines at ±50 from the center of k-space the sparse sampling factor to be applied is 6. Other functions that increase in a smooth manner include square and cubic relationships. To be smoothly varying the function should have a first order derivative that does not have any discontinuities, e.g. for the linear example of FIG. 1, the first order derivative (slope) is the same for all points considered, and in this case the second order derivative (rate of change of slope) is zero. In the case of a function involving a square term, the slope will smoothly increase while the rate of change of slope will be constant.

The formula used to determine the number of sampled points (NSP) sampled for an acquisition with a basic sample rate of R frames per second and a given sparse sampling factor (SSF) is given by the formula:

NSP=Floor(*R*/SSF)

Where the Floor operation selects the lowest whole number. For example, for R=100 frames per second and SSF=1.3, the number of sampled points is Floor(100/1.3)=76. As can be appreciated from this example, the time positions at which k-space data are sampled are in general irregularly spaced. The formula used to determine which points are sampled relative to some starting position is:

Sample Point=Floor(SPN*SSF)

Where the Floor operation selects the lowest whole number, and SPN is the sample point number.

For example, for SSF=1.3, the number of sampled points is 76. In this case SPN ranges from 1 to 76, and the relative time points at which data are sampled are 1, 2, 3, 5, 6, 7, 8, . . . 98, yielding a total of 76 points.

When using the above formulas to determine the sampled points relative to time position 1, a sampling pattern is generated that tends to be more heavily populated with points towards the beginning of the time series. To avoid this high concentration of sample points, the series is projected forward in time over several cycles and the sampling pattern for one later cycle is used as the basis for the sampling pattern. This generally results in a more even distribution of the sampled points. A number of algorithms can be used to accomplish this. The algorithm outlined here was used to produce the example images shown later:

Calculate the sample points by projecting the MACH sampling scheme over several cycles. For example when 3 cycles are chosen, if 100 time frames are to be acquired per cycle, then calculate the sampling scheme for time points ranging from 301 to 400.

Select the MACH sampling pattern for the last half of the cycle calculated above (e.g. time points 351 to 400).

Figure 2:
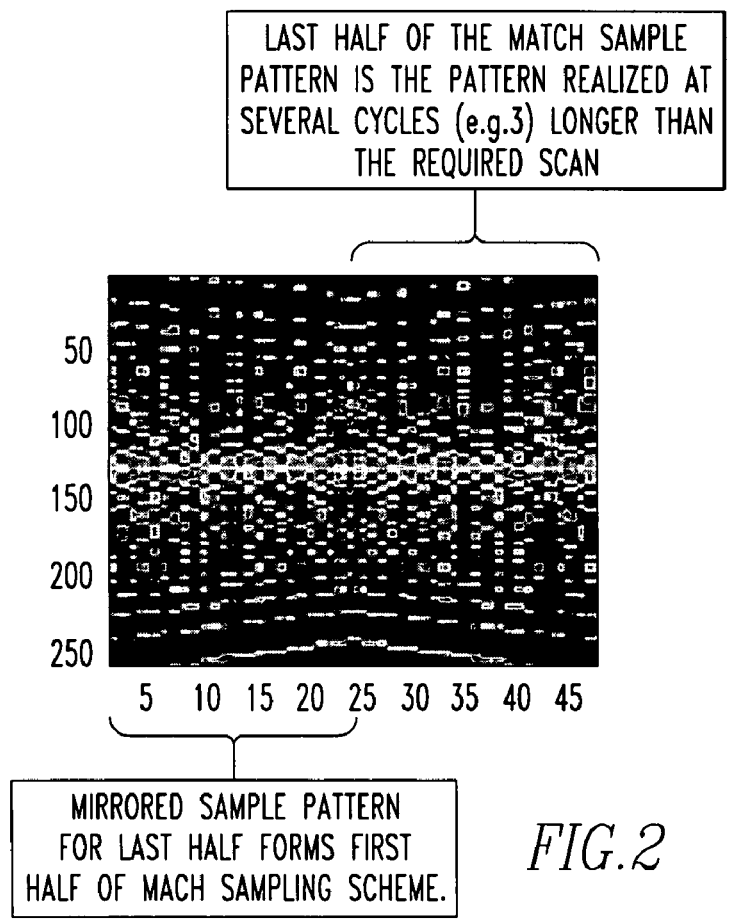
FIG. 2 is a schematic representation of the k-space-temporal sampling pattern of the sparse sampling scheme of the present invention.

Generate the mirror image of the half sampling pattern to define the first half of the sample pattern (e.g. sample points are to be based on the pattern of time points 400-351 followed by 351-400), such that where the two halves meet, the sample pattern is identical, as indicated in FIG. 2.

FIG. 2 is a schematic of the k-space-temporal sampling pattern of the MACH sparse sampling scheme. The vertical axis represents the lines of k-space to be acquired, and the horizontal axis represents the time axis. For a scan planned to obtain a number sampled time points, SP, the sample pattern of the last half of the scheme was generated by calculating the sample pattern for a time series at a multiple of SP time points (e.g. 3×SP). The latter half of this sampling pattern is mirrored and applied to the first half of the sample pattern. The pattern can be applied to sample SP sample points.

The sampling scheme outlined in FIG. 2 still typically results in a slightly higher concentration of sample points at certain irregularly distributed time points. This becomes a limiting factor when using the sampling scheme to reduce the scan time. To avoid this, some slight adjustment of the sample points can be made to distribute them more evenly. There are several algorithms that can accomplish this. A representative algorithm is:

Redistribute sample points from time positions that have more than the average number of points to the same k-space position at the nearest time point that has fewer than the average number of sampled points.

The MACH sampling pattern is used to guide the acquisition of the phase-encoded lines of k-space for a time resolved acquisition. The MACH sampling pattern can be applied directly to any MRI 10 acquisition approach that acquires k-space as a series of parallel lines. The sparsely sampled time resolved k-space data are stored in arrays in the computer 16. A record is kept to identify the order in which data were acquired.

Figure 3:
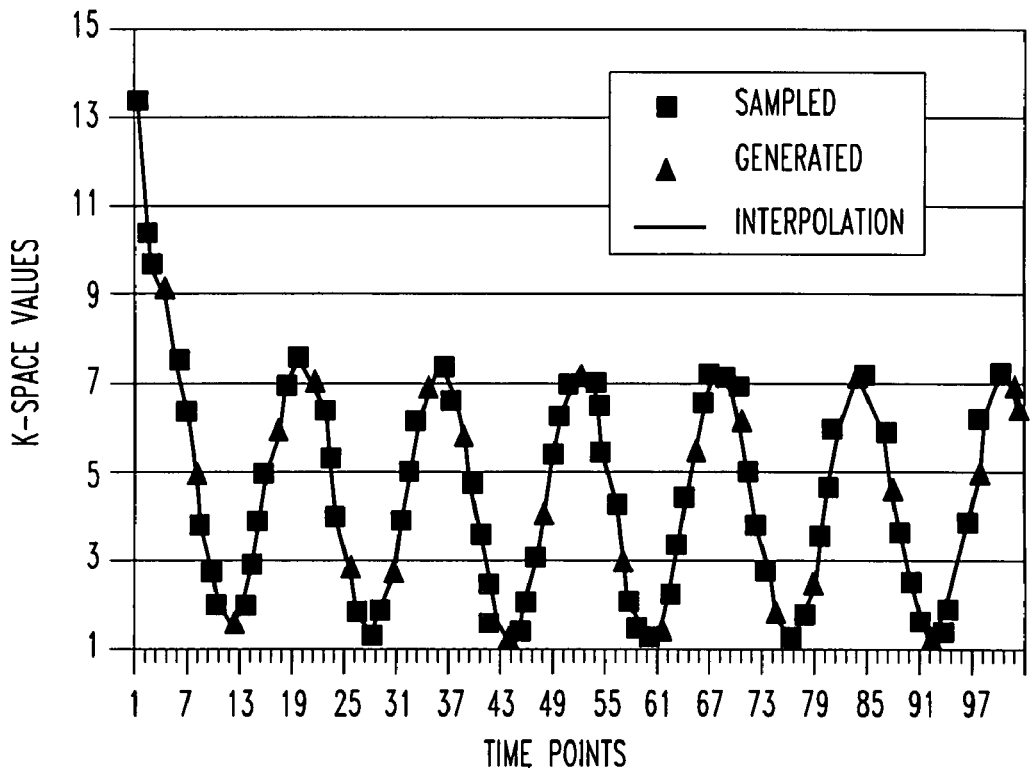
FIG. 3 shows the interpolation scheme.

For a given k-space line position, the records of the MACH sampling pattern are used to extract corresponding k-space lines for each time point. For each point of each k-space line, the time series of points are subjected to an interpolation procedure to generate k-space data corresponding to points that were not sampled, as indicated in FIG. 3. FIG. 3 shows the interpolation scheme is illustrated. Red squares represent sampled data obtained at discrete time points. The continuous blue line represents the interpolated function fitted to the sampled points. The green triangles are the interpolated points represented at discrete time points such that the combination of original (squares) and interpolated (triangles) discrete points describe a uniformly spaced series corresponding to the fully sampled series. Several algorithms can be used to interpolate the sparsely sampled data. A representative algorithm is:

For a given k-space line, the sampled data are extracted and the time points at which they were acquired are noted.

In the case of data that are expected to be cyclic, such as cardiac motion, the sampled period over which the data are captured is duplicated and positioned prior to the sampled points and following the sampled points. The corresponding time points are accordingly projected backwards or forwards in time respectively, and this information is stored.

In the case that data are not expected to be cyclic for following treatment can be performed: if data for the first time point are not sampled, data from the first sampled point are duplicated backwards to populate each time point all the way back to the first time point; similarly, if data for the last time point are not sampled, data from the last sampled point are duplicated forward to populate each time point all the way to the last time point.

For the extended multiple cycle data or the single cycle data amended as above, data interpolation is performed: either between the extended time points over three cycles (for periodic data) or between the first and last time points of the single cycle (for non-periodic data). Interpolation can be performed by a number of means including spline or cubic interpolation.

A combination of interpolated and acquired data are extracted for time points ranging from the first point to the last point, such that data for each intermediate time point are prepresented.

Figure 4:
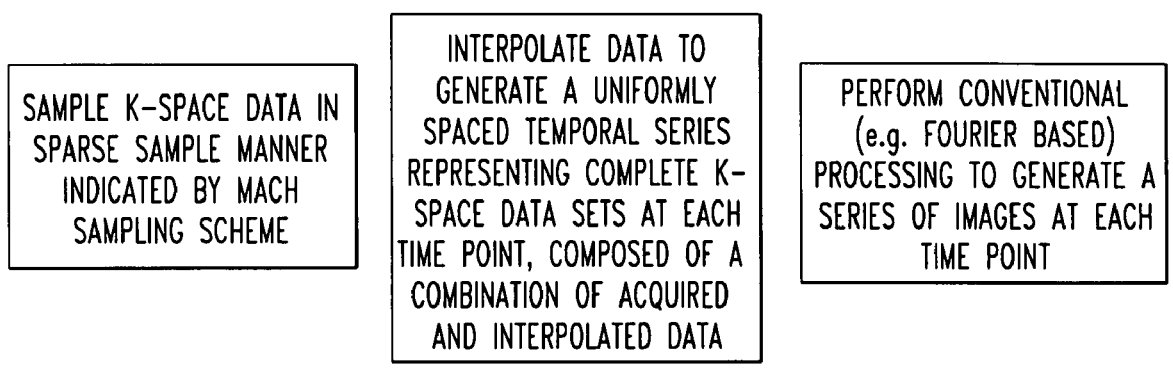
FIG. 4 is a block diagram of implementation of the present invention.

A block diagram showing the key steps in implementing MACH are shown in FIG. 4.

Figure 5:
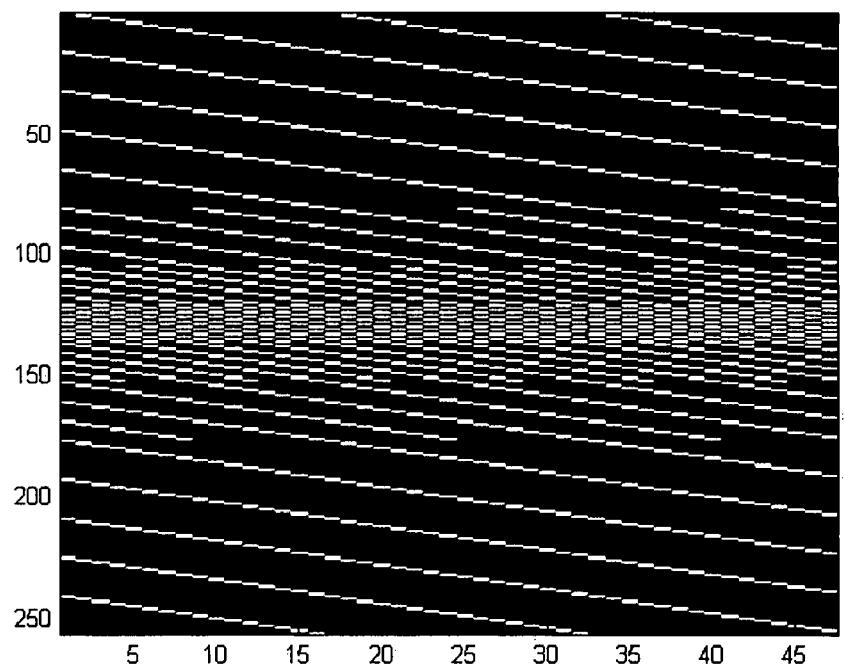
FIG. 5 is a schematic of the k-space-temporal sampling patterns of the BRISK sparse sampling scheme.
Figures 6A, 6B, 6C, 6D:
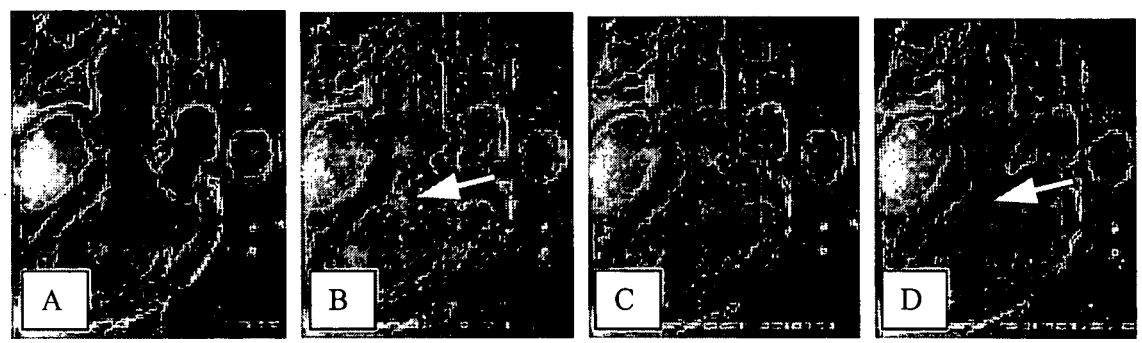
FIGS. 6a-6d show corresponding frames which illustrate the relative performance of BRISK and the present invention with respect to Gibbs ringing artifact.
Figure 7:
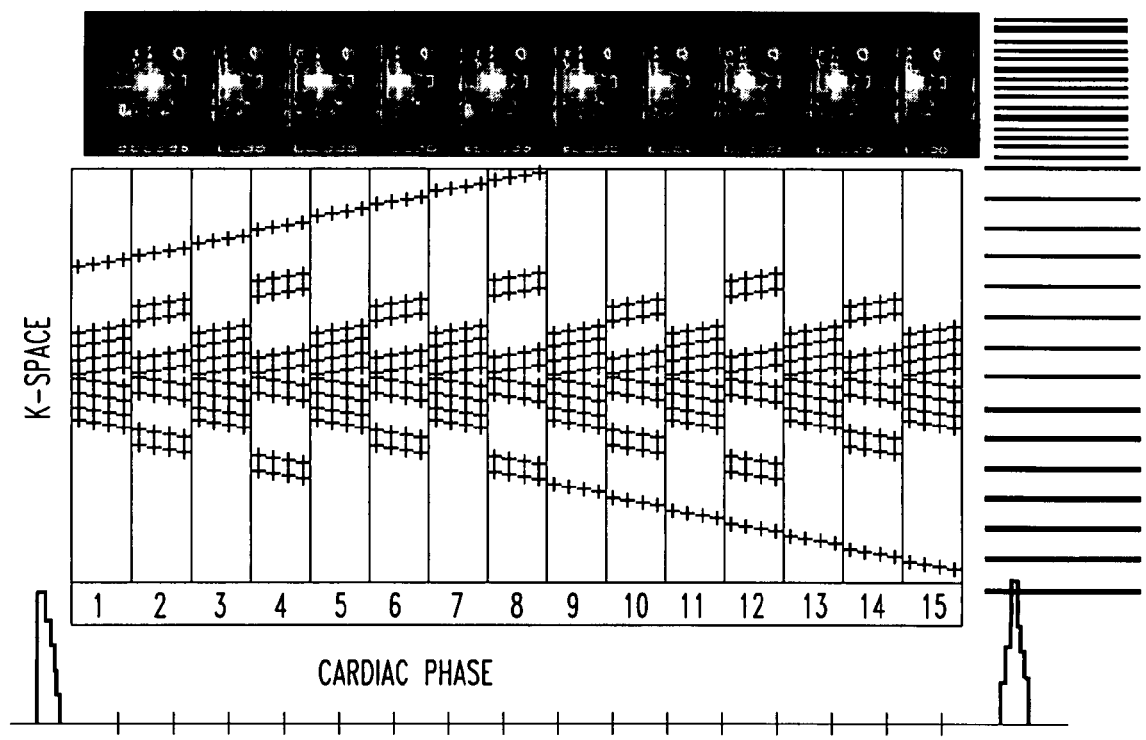
FIG. 7 is a schematic of the BRISK sampling scheme.

Previously, a related rapid imaging approach termed BRISK was described. The present invention and BRISK are similar, but there are important differences. In the previously described BRISK approach, the sampling of k-space data over the time is performed in a sparse manner (i.e. data sampling is distributed over the so called k-t domain, i.e. k-space-time domain). A key feature of BRISK is that several sparse sampling factors are employed, with the lowest factor applied towards the center of k-space and higher factors applied towards the periphery of k-space, FIG. 5. FIG. 5 is a schematic of the k-space-temporal sampling patterns of the BRISK sparse sampling scheme. The vertical axis represents the k-space axis with 256 lines. The horizontal axis represents the cardiac cycle at 48 distinct, uniformly spaced time points. The sample pattern represents an acceleration factor of 8, whereby only 32 lines are sampled at any given cardiac phase. In BRISK, the sparse sampling factors were applied to contiguous blocks of k-space, whereas in MACH, each sparse sampling factor is applied separately to each line of k-space. In BRISK, the sparse sampling factors were generally related to each other by multiples of 2, and each sparse sampling factor was applied to a block of k-space lines, whereas in MACH the sparse sampling factor increases in a smoothly varying manner and is applied to one line position. In BRISK, the sparse sampling factors that were applied to blocks of k-space that were dynamically sampled incremented by large factors, e.g. 2, allowing exact interleaving of the sampling patterns (e.g. the regions sampled at a sparse factor of 4 fit in the spaces left by regions sampled at a sparse factor of 2, etc), whereas in MACH the sparse sampling factor increases in such a manner that the sampling pattern between adjacent lines do not in general fall in a regular interleaved pattern. The key advantage of the smoothly varying sampling pattern of MACH compared to BRISK is that Gibbs ringing artifacts are reduced by approximately 50%. In the example of FIGS. 6a-6d, simulated MACH images obtained with a time reduction factor of 12 produce comparable Gibbs artifacts to a BRISK scan obtained with a time reduction factor of 8. FIGS. 6a-6d show corresponding frames illustrate the relative performance of BRISK and MACH with respect to Gibbs ringing artifact. A) Original image obtained using 256 k-space lines, B) BRISK image obtained by sampling a total of 32 lines, representing time reduction factor of 8, with noticeable Gibbs ringing artifacts, arrow points to representative artifact and others are present, C) MACH image obtained with a total of 32 lines sampled, representing a reduction factor of 8, without prominent Gibbs artifacts, D) MACH image with a total of 22 lines sampled, representing a reduction factor of 12, with Gibbs artifacts comparable to those seen in (B) corresponding to BRISK with a reduction factor of 8.

Since BRISK was introduced, others have introduced k-t sampling approaches, such as KT-BLAST, and SLAM. In general, these approaches employ a single sparse sampling factor that is uniformly applied for all k-space lines. Since a uniform sparse sampling factor is applied, there are no sudden transitions between k-space regions and thus Gibbs ringing is not a dominant artifact in these images. These techniques work best when the dynamic imaging region is restricted to 1/n of the field of view, where n is the sparse sampling factor. Under conditions where the dynamic region exceeds this extent, this class of approach is dominated by temporal blurring of each time frame. The techniques are estimated to perform at a level 50% less efficiently than BRISK, making them 100% less efficient than MACH.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

APPENDIX

The following references are incorporated by reference herein.

KT-BLAST

Tsao, J, Boesiger, P, Pruessmann, K, KT-BLAST and KT-SENSE: Dynamic MRI with High Frame Rate Exploiting Spatiotemporal Correlations; Magn. Reson. In Med. 50:1031-1042, 1003

BRISK

Doyle, M., Walsh, E. G., Foster, R. E., Pohost, G. M. "Rapid Cardiac Imaging with Turbo BRISK" Magn. Reson. in Med 1997; 37:410-417.

SLAM

Wolfgang G. Rehwald, PhD, Raymond J. Kim, MD, Orlando P. Simonetti, PhD, Gerhard Laub, PhD and Robert M. Judd, PhD Theory of High-Speed MR Imaging of the Human Heart with the Selective Line Acquisition Mode Radiology. 2001; 220:540-547.

The invention claimed is:

1. An MRI comprising:

at least a singular imaging channel which uses a smoothly varying sampling pattern to sparsely sample k-space as a series of parallel lines over time to acquire data of an object; and a computer in communication with the imaging channel that performs a signal processing routine to interpolate the data and fill in points of k-space which were not sampled by the imaging channels and produce an image of the object, the sparse sampling pattern varies from the center of k-space to the periphery, the sparse sampling factor of the sampling pattern varies in a progressively increasing manner from the center of k-space to the periphery, the progressively increasing sparse sampling pattern smoothly varies such that the first-order derivative of the sparse sampling factor plotted from the center of k-space to the periphery does not have any discontinuities.

2. An MRI as described in claim 1 wherein the computer redistributes sample points from time positions that have more than the average number of points to the same k-space position at a nearest time point that has fewer than the average number of sample points.

3. An MRI as described in claim 2 wherein the signal processing routine performed by the computer does not use training data.

4. An MRI as described in claim 3 wherein the sparsely sampled data are interpolated along a temporal dimension to populate data points that were not directly acquired by the imaging channel.

5. An MRI as described in claim 4 including at least a second imaging channel which uses a smoothly varying sampling pattern to sparsely sample k-space as a series of parallel lines over time to acquire data of an object, the computer in communication with the imaging channels that performs a signal processing routine to interpolate the data and fill in points of k-space which were not sampled by the imaging channels and produce an image of the object.

6. A method for using an MRI comprising the steps of:

acquiring data of an object with at least a singular imaging channel of the MRI which uses a smoothly varying sampling pattern to sparsely sample k-space as a series of parallel lines over time, including the step of acquiring data of the object with the imaging channel which uses the sparse sampling pattern that varies from the center of k-space to the periphery, and where the sparse sampling factor of the sampling pattern varies in a progressively increasing manner from the center of k-space to the periphery;

performing a signal processing routine with a computer in communication with the imaging channel to interpolate the data and fill in points of k-space which were not sampled by the imaging channels; and producing an image of the object.

7. A method as described in claim 6 wherein the acquiring step includes the step of acquiring data of the object with the imaging channel where the progressively increasing sparse sampling pattern smoothly varies such that the first-order derivative of the sparse sampling factor plotted from the center of k-space to the periphery does not have any discontinuities.

8. A method as described in claim 7 wherein the performing step includes the step of redistributing with the computer sample points from time positions that have more than the average number of points to the same k-space position at a nearest time point that has fewer than the average number of sample points.

9. A method as described in claim 8 wherein the signal processing routine performed by the computer does not use training data.

10. A method as described in claim 9 wherein the performing step includes the step of interpolating the sparsely sampled data along a temporal dimension to populate data points that were not directly acquired by the imaging channel.

11. A method as described in claim 10 wherein the acquiring step includes the step of acquiring data of the object with at least a second imaging channel of the MRI which uses a smoothly varying sampling pattern to sparsely sample k-space as a series of parallel lines over time.

* * * * *